(12) United States Patent
Milo et al.

(10) Patent No.: US 11,211,320 B2
(45) Date of Patent: Dec. 28, 2021

(54) PACKAGE WITH SHIFTED LEAD NECK

(71) Applicant: TEXAS INSTRUMENTS INCORPORATED, Dallas, TX (US)

(72) Inventors: Dolores Babaran Milo, Baguio (PH); Joe Ann Feive Carbonell Lopez, Baguio (PH); Gloria Bibal Manaois, Baguio (PH); Kevin John Bersamira Delos Santos, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 121 days.

(21) Appl. No.: 16/731,748

(22) Filed: Dec. 31, 2019

(65) Prior Publication Data

US 2021/0202365 A1    Jul. 1, 2021

(51) Int. Cl.
*H01L 23/498* (2006.01)
*H01L 23/31* (2006.01)
*H01L 23/00* (2006.01)

(52) U.S. Cl.
CPC .... *H01L 23/49838* (2013.01); *H01L 23/3114* (2013.01); *H01L 23/49811* (2013.01); *H01L 23/49861* (2013.01); *H01L 24/45* (2013.01); *H01L 2924/17151* (2013.01)

(58) Field of Classification Search
CPC ................................................. H01L 23/49861
See application file for complete search history.

(56) References Cited

U.S. PATENT DOCUMENTS

| | | | |
|---|---|---|---|
| 5,844,306 A * | 12/1998 | Fujita | H01L 23/49503 257/676 |
| 7,504,713 B2 | 3/2009 | Holloway et al. | |
| 7,683,482 B2 | 3/2010 | Nishida et al. | |
| 7,808,089 B2 | 10/2010 | Nguyen et al. | |
| 8,044,495 B2 | 10/2011 | Abbott | |
| 8,058,706 B2 | 11/2011 | Feng et al. | |
| 8,067,826 B2 | 11/2011 | Son et al. | |
| 8,698,291 B2 | 4/2014 | Sanchez et al. | |
| 8,975,734 B2 | 3/2015 | Tsai et al. | |
| 9,515,036 B2 | 12/2016 | Yu et al. | |
| 9,627,299 B1 | 4/2017 | Flessner | |
| 9,780,069 B2 | 10/2017 | Haga et al. | |
| 9,922,908 B2 | 3/2018 | Chang et al. | |
| 10,217,699 B2 * | 2/2019 | Huang | H01L 23/49548 |
| 2003/0062601 A1 * | 4/2003 | Hamden | H01L 24/48 257/666 |

(Continued)

*Primary Examiner* — William A Harriston
(74) *Attorney, Agent, or Firm* — Dawn Jos; Charles A. Brill; Frank D. Cimino

(57) ABSTRACT

A semiconductor package includes a pad and leads having a planar profile shaped from a planar base metal, a semiconductor die attached to the pad, a wire bond extending from the semiconductor die to a respective lead, and mold compound covering the semiconductor die, the wire bond, and a first portion of the respective lead, wherein a second portion of the respective lead extends beyond the mold compound. A shape of the respective lead within the planar profile includes a notch indented relative to a first elongated side of the shape of the respective lead and a protrusion protruding outwardly relative to a second elongated side of the shape of the respective lead. The notch and the protrusion are each partially covered by the mold compound and partially outside the mold compound.

15 Claims, 10 Drawing Sheets

(56) References Cited

U.S. PATENT DOCUMENTS

| | | | |
|---|---|---|---|
| 2007/0035019 A1 | 2/2007 | Carney et al. | |
| 2007/0252247 A1* | 11/2007 | Kim | H01L 23/49503 |
| | | | 257/666 |
| 2011/0108963 A1* | 5/2011 | Balakrishnan | H01L 23/3107 |
| | | | 257/670 |
| 2011/0108965 A1* | 5/2011 | Hess | H01L 23/49548 |
| | | | 257/676 |
| 2011/0272793 A1* | 11/2011 | Shimizu | H01L 21/4832 |
| | | | 257/666 |
| 2014/0367838 A1 | 12/2014 | Abbott et al. | |
| 2015/0262918 A1 | 9/2015 | Tran et al. | |
| 2018/0236696 A1* | 8/2018 | Kaneko | H01L 23/49513 |
| 2020/0235057 A1* | 7/2020 | Hud | H01L 23/49562 |
| 2020/0357987 A1* | 11/2020 | Li | G01R 15/202 |

* cited by examiner

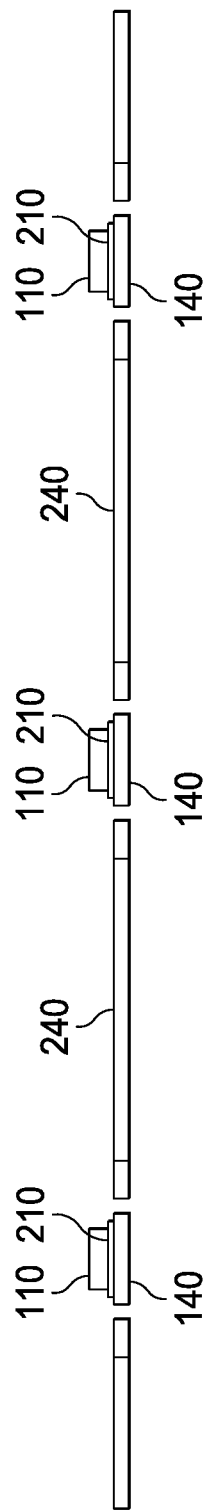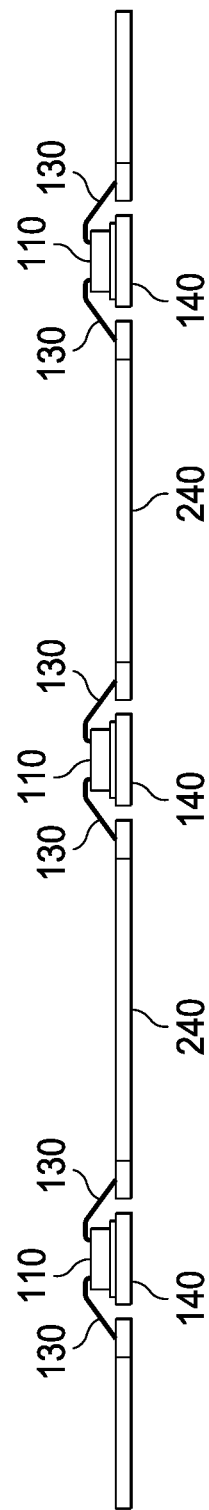

PACKAGE WITH SHIFTED LEAD NECK

TECHNICAL FIELD

This disclosure relates to semiconductor packages.

BACKGROUND

Moisture-induced failures of semiconductor packages, such as packages made with epoxy-based mold compounds, have been observed and investigated for many years. Interfacial delamination between mold compounds and other package components is particularly problematic as it allows water films to form on free surfaces at delamination sites. Water films may lead to corrosion of electronic components within the package. In addition, quick rises of temperature may vaporize the water and initiate expansive internal pressures between the components and the mold compound. Temperatures above the boiling point of water create steam and pressure which can bulge and crack the mold compound. As an example, such high temperatures may occur during reflow of semiconductor package solder balls for attaching the semiconductor package to a board.

A variety of techniques are utilized to mitigate this delamination issue by enhancing adhesion between the different device components (package compound, semiconductor die, substrate, leadframe, etc.). Such techniques include chemically purifying mold compounds, activating leadframe metal surfaces, for instance by plasma, just prior to the molding process, enhancing the affinity of leadframe metals to mold compounds by oxidizing the base metal or by depositing special metal layers (such as rough tin), and coining the leadframes for creating dimples and other three-dimensional surface features and roughness for improved interlocking of the mold compound with the surfaces of the enclosed parts. However, these techniques have not eliminated the issues of delamination and moisture-induced failures in semiconductor packages.

BRIEF SUMMARY

Semiconductor packages disclosed herein include a modified lead neck design that mitigates delamination between leads and mold compound of a package. For example, such delamination may occur as a result of forces applied to bend a flat lead into its final position during manufacturing. Modified lead neck designs disclosed herein include a shifted lead neck including a shifted portion within a mold block and an offsetting shifted portion outside the mold block. The lead extends outwardly from the mold block opposite the offsetting shifted portion outside the mold block. The shifted portion within the mold block engages the mold block to isolate pulling forces and bending stress to portions of the lead outside the mold block. Such isolation mitigates delamination between the lead and the mold block.

In one example, a semiconductor package includes a pad and leads having a planar profile shaped from a planar base metal, a semiconductor die attached to the pad, a wire bond extending from the semiconductor die to a respective lead, and mold compound covering the semiconductor die, the wire bond, and a first portion of the respective lead. A second portion of the respective lead extends beyond the mold compound through a surface of the mold compound. A shape of the respective lead within the planar profile includes a lead neck within and adjacent to the mold compound and a lead leg adjacent to the lead neck and outside the mold compound. The lead neck forms a first side at least partially within the mold compound, the first side extending at a first angle of 30 to 60 degrees relative to the surface of the mold compound through which the lead neck extends. The lead neck forms a second side at least partially outside the mold compound, the second side adjacent the first side and extending at a second angle of 30 to 60 degrees relative to the surface of the mold compound through which the lead neck extends. The lead neck forms a third side at least partially within the mold compound, the third side opposite the first side and extending at a third angle of 120 to 150 degrees relative to the surface of the mold compound through which the lead neck extends. The lead neck forms a fourth side at least partially outside the mold compound, the fourth side adjacent the second side and extending at a fourth angle of 120 to 150 degrees relative to the surface of the mold compound through which the lead neck extends.

In another example, a semiconductor package includes a pad and leads having a planar profile shaped from a planar base metal, a semiconductor die attached to the pad, a wire bond extending from the semiconductor die to a respective lead, and mold compound covering the semiconductor die, the wire bond, and a first portion of the respective lead, wherein a second portion of the respective lead extends beyond the mold compound. A shape of the respective lead within the planar profile includes a notch indented relative to a first elongated side of the shape of the respective lead and a protrusion protruding outwardly relative to a second elongated side of the shape of the respective lead. The notch and the protrusion are each partially covered by the mold compound and partially outside the mold compound.

BRIEF DESCRIPTION OF THE DRAWINGS

FIGS. 3A-3G illustrate conceptual process steps for manufacturing a semiconductor package including leads with shifted lead necks, such as the semiconductor package of FIGS. 1A-1F.

DETAILED DESCRIPTION

As disclosed herein, semiconductor packages may include a leadframe with a pad and one or more leads separated from the pad, a semiconductor die bonded on the pad, and a mold compound covering the pad, the semiconductor die and portions of the leads. The semiconductor packages may be created by a molding process, wherein a polymer compound (such as an epoxy formulation filled with inorganic granules) is molded around an assembled semiconductor die and leadframe portions. In this process, the leadframe with the attached and bonded semiconductor die is placed in the cavity of a steel mold. Viscous mold compound is pressured into the cavity to fill the cavity and surround the semiconductor die and leadframe portions without voids. After polymerizing the compound, for example, by cooling to ambient temperature, the mold is opened, while the mold compound remains adhered to the molded parts.

The reliability of adhesion between the mold compound and the covered parts during manufacture and operation is important to the reliability of a semiconductor package. For example, mechanical interlocking of compound and parts should handle physical expansions and contractions based on different coefficients of thermal expansion to prevent delamination. In addition, the mechanical interlocking of compound and parts should handle mechanical stresses during post-molding manufacturing processes and operation of the semiconductor package. In particular, bending leads into their final positions following molding of a semiconductor package creates significant mechanical stresses at the interfaces of leads and the mold compound, which can cause delamination.

As disclosed herein, leads of the leadframe include shifted lead necks to isolate mechanical pulling forces and bending stress on the leads during manufacturing, thereby mitigating delamination between the leads and mold compound. One such example, semiconductor package 100, is illustrated in FIGS. 1A-1F.

Figure 1A:
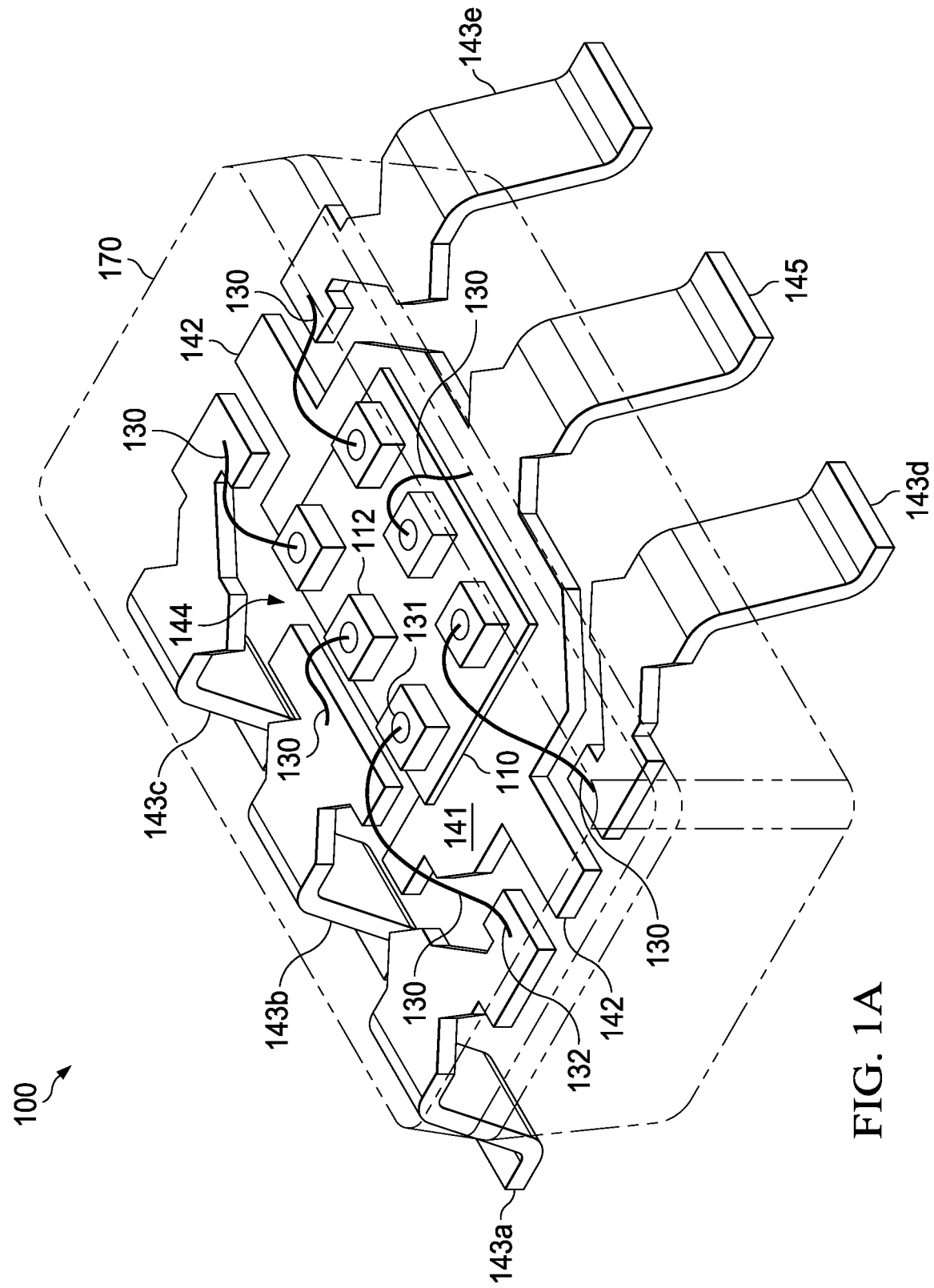
FIG. 1A is a perspective hidden view of a semiconductor package including leads with shifted lead necks.
Figure 1B:
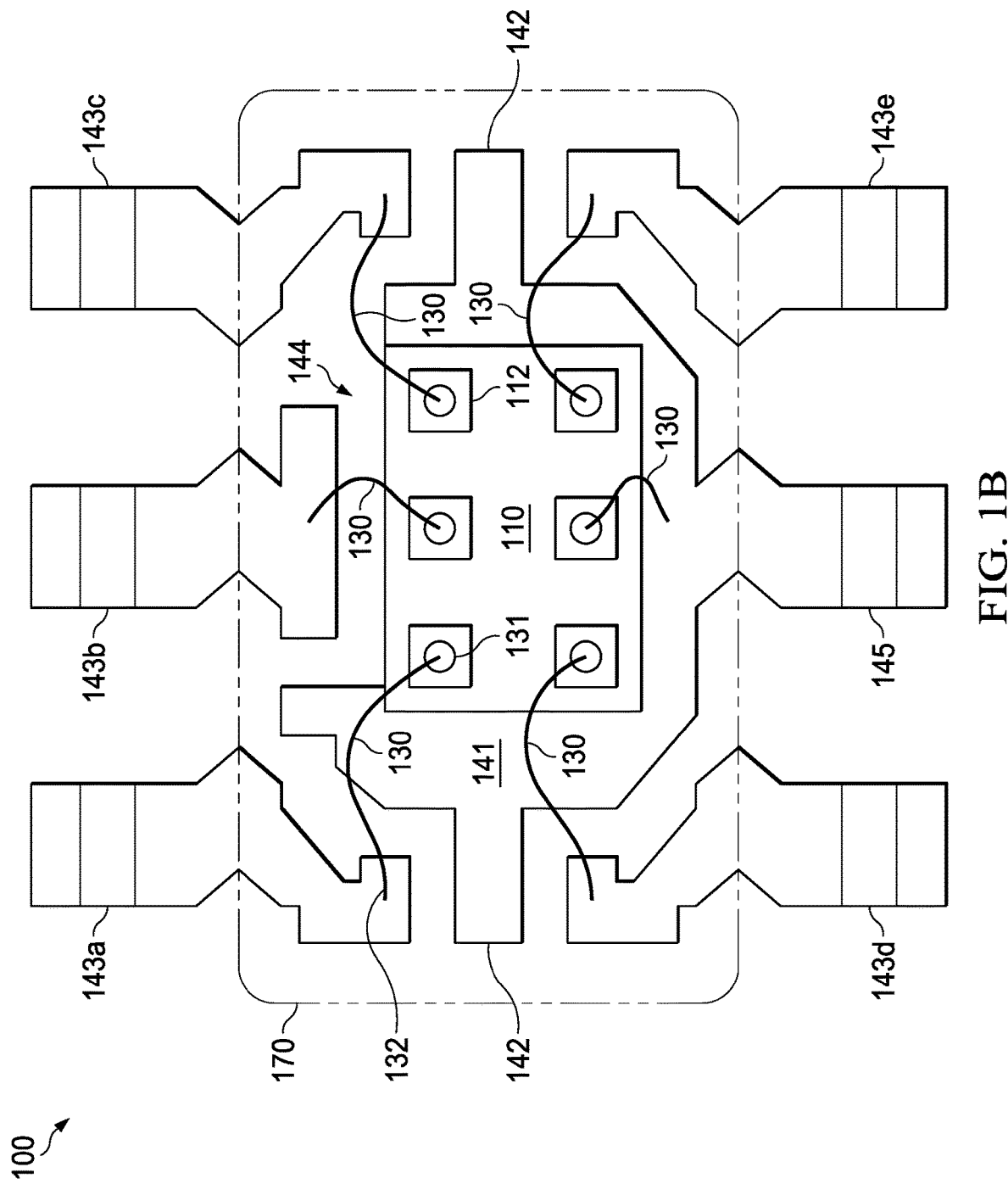
FIG. 1B is a top hidden view of the semiconductor package of FIG. 1A.
Figure 1C:
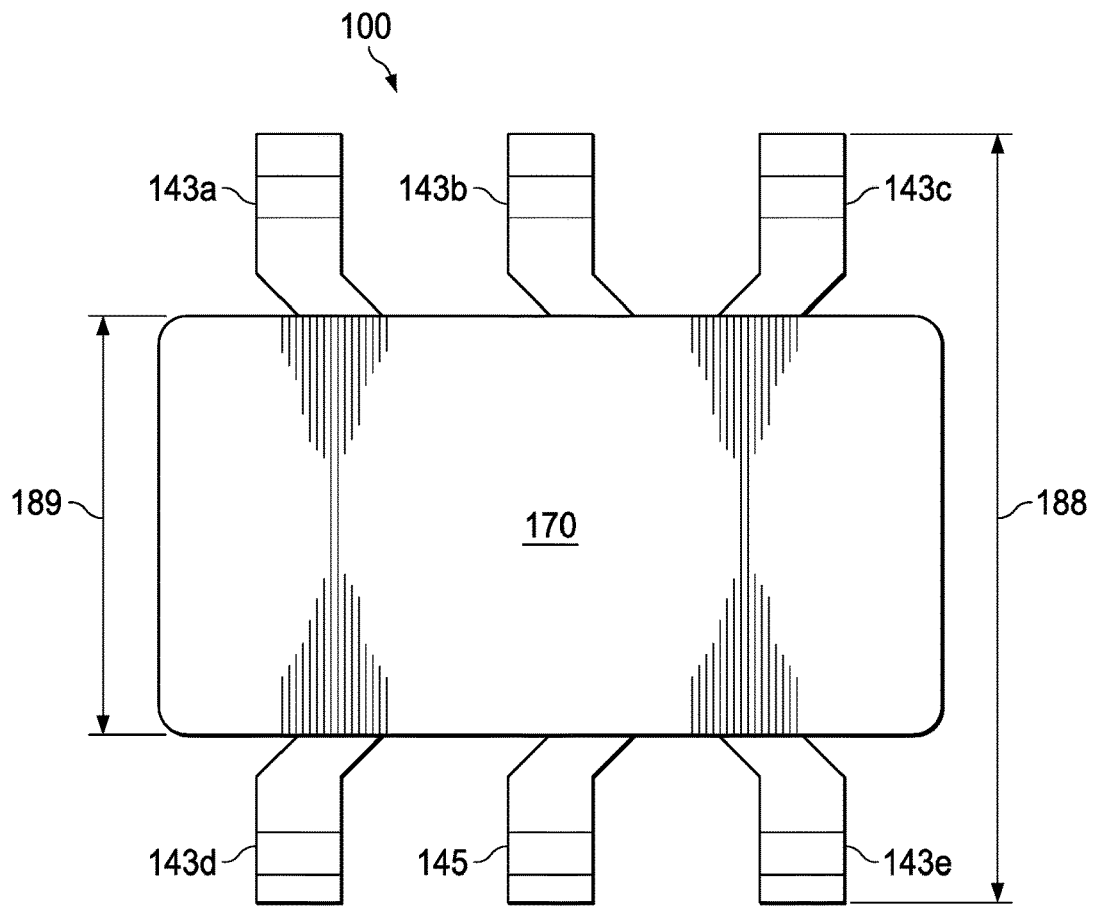
FIGS. 1C-1F are top, side, front and close-up views of the semiconductor package of FIGS. 1A and 1B.
Figure 1D:
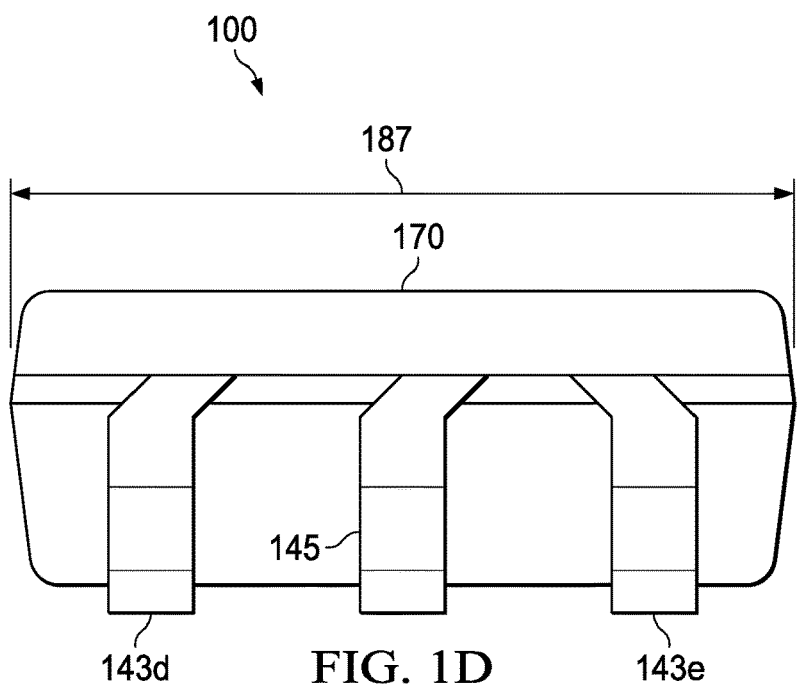
Figure 1E:
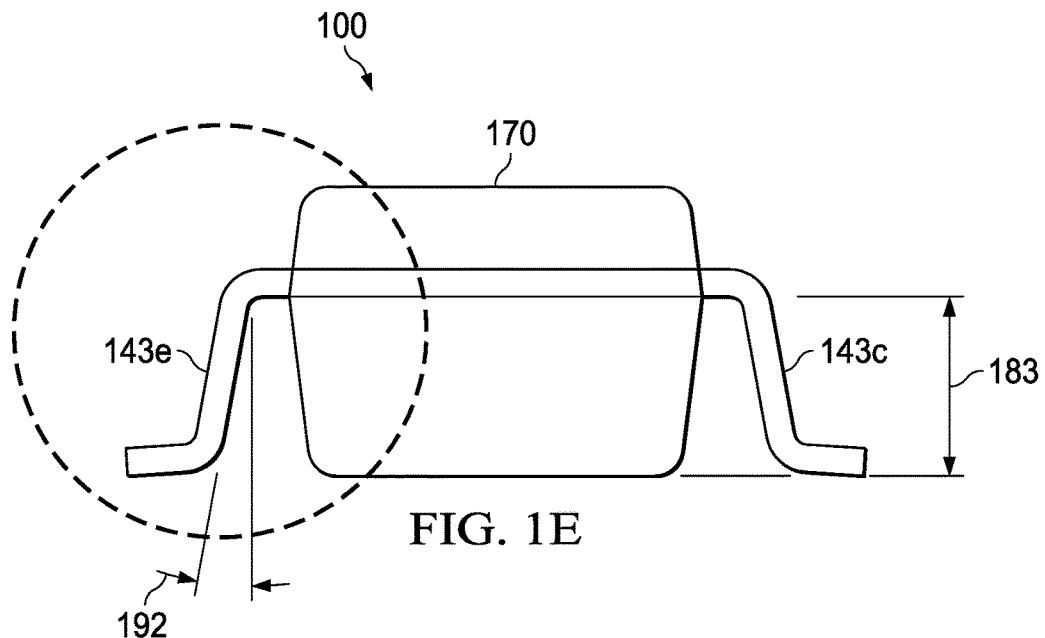
Figure 1F:
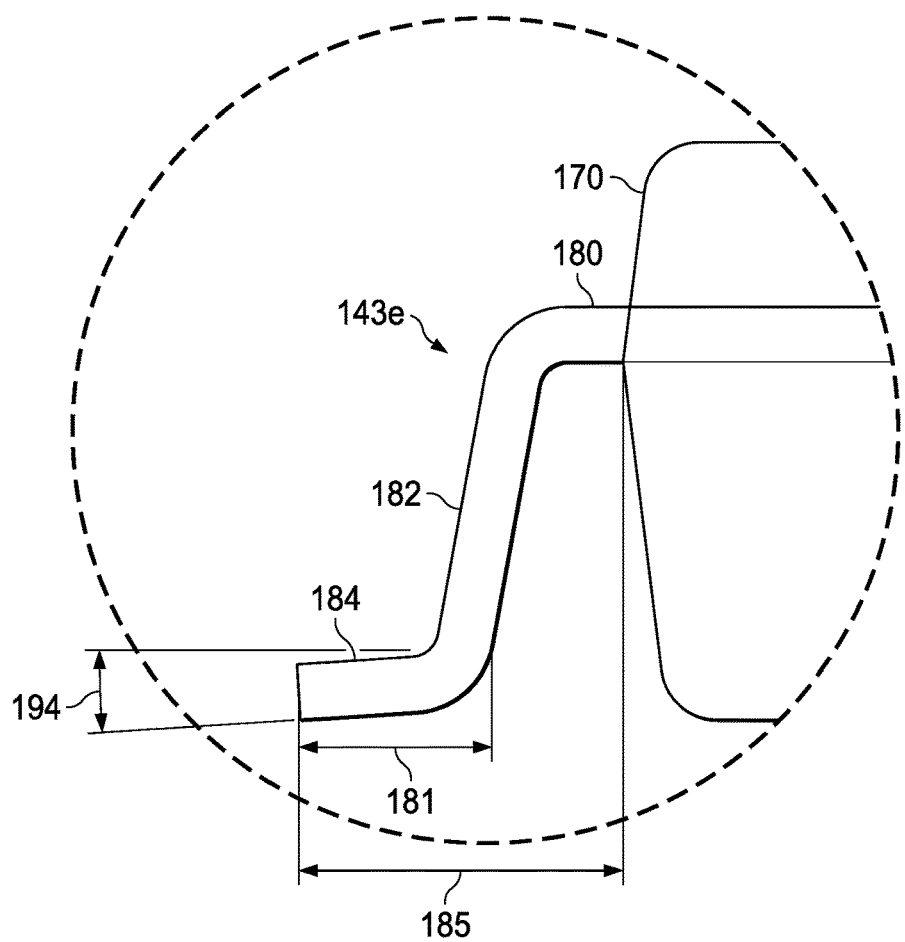

FIG. 1A is a perspective view of semiconductor package 100, and FIG. 1B is a top hidden view of semiconductor package 100. In addition, FIGS. 1C-1F are top, side, front and close-up views respectively of semiconductor package 100. Semiconductor package 100 includes a leadframe 140 with a pad 141, five leads 143a, 143b, 143c, 143d, 143e (collectively, "leads 143") and one elongated pad lead 145, which extends from pad 141. Semiconductor die 110 is mounted to leadframe pad 141, and semiconductor package 100 further includes a mold compound 170 covering pad 141, semiconductor die 110, and portions of each of leads 143 and pad lead 145. Portions of leads 143 covered by mold compound 170 are co-planar with pad 141, while portions of leads 143 outside mold compound 170 are bent out-of-plane.

Each of leads 143 and pad lead 145 include a shifted lead neck in accordance with the techniques of this disclosure. As referred to herein, a lead with a shifted lead neck, such as each of leads 143 and pad lead 145, includes a notch, such as notch 154 (FIG. 2B), and a protrusion, such as protrusion 164 (FIG. 2B). The notch and the protrusion are on opposing sides of the lead and are each partially covered by mold compound 170 and partially outside mold compound 170. The notch and the protrusion combine to provide a shifted portion within mold compound 170 and an offsetting shifted portion outside mold compound 170.

The design of semiconductor package 100 and leadframe 140 may mitigate the prevalence and severity of corrosion within lead stitch areas due to delamination between leads 143 or pad lead 145 and mold compound 170. For example, the shifted lead necks of leads 143 and pad lead 145 may isolate pulling forces and bending stress on the leads during manufacturing, thereby mitigating delamination between the leads and mold compound 170. While any degree of delamination may cause reliability issues, such delamination may be particularly problematic when it reaches a lead stitch area, such as lead stitch area 151 (FIG. 2B). For example, lead stitch areas may be susceptible corrosion from to moisture intrusion following delamination as corrosion resistant properties of a leadframe, such as a plated layer, may be degraded or minimized by wire bonding within the lead stitch area.

Leads 143 are spaced from pad 141 by gaps 144a, 144b, 144c, 144d, 144e (collectively, "gaps 144"). Pad lead 145 directly connects to pad 141 to provide an electrical connection thereto. While leadframe 140 includes five leads 143 and one pad lead 145, the techniques of this disclosure may be applied to any package configuration with leads. For example, other semiconductor packages may include more or less leads, such as at least four leads, at least eight leads, or even sixteen or more leads.

Leadframe 140, including pad 141, leads 143, pad lead 145 has a planar profile 148 (FIG. 2A) shaped from a planar base metal. In various examples, the base metal of leadframe 140 may include copper, copper alloys, aluminum, aluminum alloys, iron-nickel alloys, or nickel-cobalt ferrous alloys. For many devices, the parallel surfaces of the flat leadframe base metal are treated to create strong affinity for adhesion to plastic compound, especially mold compounds. As an example, the surfaces of copper leadframes may be oxidized, since copper oxide surfaces are known to exhibit good adhesion to mold compounds. Other methods include plasma treatment of the surfaces, or deposition of thin layers of other metals on the base metal surface. In some examples, the planar base metal may be plated with a plated layer enabling metal-to-metal bonding and resistant to oxidation. In an example, the plated layer may include a layer of nickel plated on the base metal and a layer of palladium plated on the nickel layer. Some of such examples, a layer of gold may be plated on the palladium layer. As an example for copper leadframes, plated layers of tin may be used, or a layer of nickel, about 0.5 to 2.0 µm thick in some examples, followed by a layer of palladium, about 0.01 to 0.1 µm thick in the same or different examples, optionally followed by an outermost layer of gold, about 0.003 to 0.009 µm thick in the same or different examples. Such base metal and plating combinations provide resistance to corrosion, such as oxidation, at exposed portions of the leadframe while facilitating wire bonds between leadframe 140 and bond pads 112 of semiconductor die 110.

Leadframes, such as leadframe 140, are formed on a single sheet of metal by stamping or etching. Multiple interconnected leadframes may be formed from a single sheet of substrate, the interconnected leadframes referred to as a leadframe strip. Leadframes on the sheet can be arranged in rows and columns. Tie bars, such as tie bars 142, interconnect leads and other elements of a leadframe to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to lead attachment, such as wire bonding, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate semiconductor packages, each semiconductor package including a singulated leadframe, at least one die, electrical connections between the die and leadframe (such as gold or copper bond wires) and the mold compound which covers at least part of these structures.

Tie bars and siderails may be removed during singulation of the packages formed with a single leadframe strip. The term leadframe of represents the portions of the leadframe strip remaining within a package after singulation. With respect to semiconductor package 100, leadframe 140 includes pad 141, two tie bars 142, five leads 143, and pad lead 145, although some of these elements are not interconnected following singulation of semiconductor package 100 into a discrete package.

Semiconductor die 110 is mounted on pad 141. Semiconductor die 110 may be implemented using any semiconductor material employed in industry, such as a silicon, gallium arsenide, gallium nitride, silicon germanium, or any other semiconductor material employed in industry. Semiconductor die 110 includes bond pads 112, which are electrically connected to each of leads 143 and pad lead 145 via individual wire bonds 130.

Each wire bond 130 connects one of bond pads 112 with a ball bond and to one of leads 143 or pad lead 145 with a stitch bond. Wire bonds 130 each include a metal wire extending from a respective bond pad 112 to a respective lead 143. Each of wire bonds 130 include a ball bond by a squashed ball attached to either the respective bond pad 112 or the respective lead 143, and a stitch bond attached to the other of the respective bond pad 112 and the respective lead 143. Ball bond 131 and stitch bond 132 are indicated with respect to the wire bond 130 associated with lead 143a, and a representative of ball bonds and stitch bonds for each of wire bonds 130. Stitch bonds are generally less resistant to oxidation than leadframe 140, for example, due to the disruption the stitch bond may have to a plated layer over the leadframe base metal. For this reason, it is particularly important that mold compound 170 adheres to leadframe 140 to protect wire bonds 130 from moisture intrusion.

The metal wires of wire bonds 130, are made of electrically conductive materials, such as copper, gold, or aluminum, and may have diameters between about 15 and 33 μm in some examples. A wire bonding process may begin with positioning semiconductor die 110 on a heated pedestal to raise the temperature to between 150 and 300° C. For copper and aluminum wires, ball formation and bonding may need to be performed in a reducing atmosphere such as dry nitrogen gas with a few percent hydrogen gas.

With the wire bonding process, the wire is strung through the capillary of an automated bonder. A capillary is an elongated tube of an inert material such as a ceramic with a fine bore (the capillary in the strict sense) suitable for guiding a metal wire used to form the wire bonds. At the wire end extruding from the capillary tip, a free air ball may be created by melting the wire end using either a flame or a spark technique. The ball may have a diameter from about 1.2 to 1.6 times the wire diameter. The capillary is moved towards an attachment area of either leadframe 140 or one of bond pads 112. For a bond pad, the attachment area may be an alloy of aluminum and copper, for an attachment area of the leadframe, the attachment area may consist of the leadframe base metal or include one of the coating metal discussed above. The free air ball of melted wire is pressed against the metallization of the attachment area by a compression force, often combined with ultrasonic movement of the ball relative to the attachment area, transmitting ultrasonic energy, in order to create a ball bond, such as ball bond 131, as indicated with respect to the wire bond 130 associated with lead 143a.

In specific examples, the compression force may be between about 17 and 75 gram-force/square-centimeter (about 1670 to 7355 Pascals); the ultrasonic time between about 10 and 30 milliseconds; the ultrasonic power between about 20 and 50 milliwatts. The bonding process results in a metal nail head or squashed ball, such as ball bond 131. In a specific example of ball bond 131, the attachment process of squashing free air balls against the metal, such as aluminum, of bond pads 112 may create layers of intermetallic compounds of a total thickness between about 50 and 100 nanometers.

In other examples, the attachment process of squashing free air balls against a different metal, such as palladium or gold, which may be associated with plated leads 143 creates metal interdiffusion. Metal interdiffusion is also the process which provides strength to stitch bonds, such as stitch bond 132, as indicated with respect to the wire bond 130 associated with lead 143a, where ultrasonic agitation is not provided.

After the ball attachment, the capillary with the wire may be lifted to span an arch from the ball bond, such as ball bond 131, to an attachment area on a substrate or a leadframe, such as a lead stitch area of one of leads 143 or pad lead 145. When the wire touches the attachment area surface, the capillary tip is pressed against the wire in order to flatten it and thus to form a stitch bond, such as stitch bond 132, sometimes referred to as a wedge bond.

For substrate-based attachment areas, the bonding temperature may be about 160° C.; whereas for leadframe-based attachment areas, the bonding temperature may be between 240 and 260° C. The bonding force may be in the range from about 50 to 150 gram-force, and the ultrasonic energy may be in the range from about 80 to 180 milliamps. The attachment process forms metal interdiffusions or welds.

The capillary rises again to a height sufficient to display a length of wire with enough metal to form the next ball. Then, a tear method is initiated to break the wire near the end of the stitch bond and leave the exposed wire length dangling from the capillary tip ready for the next ball-forming melting step. Various wire-breaking methods are commonly employed, such as a clamp-tear method and a table-tear method.

While the figures depict ball bond 131 at a bond pad 112, and stitch bond 132 on lead 143a, the reverse may also be true with a stitch bond on a bond pad and a ball bond on a lead. However, stitch bonds generally requires a larger attachment area than ball bonds, so in examples in which semiconductor die attachment areas are too small for stitch bonds, wire bonds are oriented as shown in the figures: with ball bonds at a semiconductor die attachment areas and stitch bonds at leadframe-based attachment areas.

Mold compound 170 forms an overmold that covers leadframe pad 141, semiconductor die 110, portions of leads 143 and pad lead 145, as well as wire bonds 130. Mold compound 170 provides a protective outer layer for semiconductor die 110 and wire bonds 130 formed in a molding process. In some examples, mold compound 170 includes an epoxy such as an epoxy-based thermoset polymer. Satisfactory operation of most semiconductor devices requires reliable adhesion between the packaging compound and the covered parts since delamination degrades the capability to keep moisture and impurities out and interferes with conductive heat dissipation. Leads 143 and pad lead 145 include shifted lead neck that may isolate pulling forces and bending stress on the leads during manufacturing, thereby mitigating delamination between the leads and mold compound 170. Leadframe 140 with leads 143 and pad lead 145 having shifted lead necks are shown and described in further detail with respect to FIGS. 2A and 2B.

FIGS. 1C-1F are top, side, front and close-up views respectively of semiconductor package 100. In the example of semiconductor package 100, leads 143 are shaped as cantilevered or "gull-wing" leads; however, the disclosed techniques may be applied to any package design in which leads are bent out of plane, including leads in a J shape rather than a gull-wing shape. Such packages include variations of, but are not limited to, small-outline package (SOP), including thin small-outline package (TSOP) and very thin small-outline package (VTSOP), small-outline transistor (SOT), leaded chip carriers (LCC), and small-outline integrated circuit (SOIC). The dimensions and configuration of semiconductor package 100 depicted in the drawings and description conform to a 2.9×1.6 millimeter (mm) 6 pin SOT package.

Semiconductor package 100 is a six-lead package, including five leads 143 and a single pad lead 145. In this specific example, a package length 187 is 2.90±0.05 mm, a total package width 188 measured to the ends of the leads is 2.87±0.05 mm, and a mold compound 170 width 189 is 1.60±0.05 mm.

Each of leads 143 and pad lead 145 includes a common bent profile extending beyond mold compound 170 by a width 181 (0.622 mm). The common bent profile includes an exposed coplanar section 180, a central portion 182 with a vertical distance 183 (0.61 mm) relative to exposed coplanar section 180, and a foot portion 184 of horizontal length 185 (0.425±0.075 mm). As referred to herein, horizontal represents a direction parallel to a plane of leadframe pad 141 and exposed coplanar section 180, while vertical represents a direction perpendicular to the plane of leadframe pad 141.

Each of leads 143 and pad lead 145 form a first out-of-plane bend outside and adjacent to mold compound 170 with an angle between 80 and 90 degrees separating exposed coplanar section 180 and central portion 182. In addition, each of leads 143 and pad lead 145 form a second out-of-plane bend in a opposite direction outside mold compound 170 past the first out-of-plane bend with a second angle of between 80 and 90 degrees, the second angle opposite the first angle such that a distal end of lead 143b beyond second bend is within 10 degrees of parallel with pad 141 of leadframe 140. In some of such examples, central portion 182 is at an angle 192 of 0° to 5° relative to vertical, and foot portion 184 is at an angle 194 of 0° to 6° relative to horizontal. These dimensions and configuration of semiconductor package 100 are merely one example implementation of the techniques disclosed herein. The techniques of this disclosure may be readily applied to packages with varying dimensions, more or less leads and/or other lead configurations.

Figure 2A:
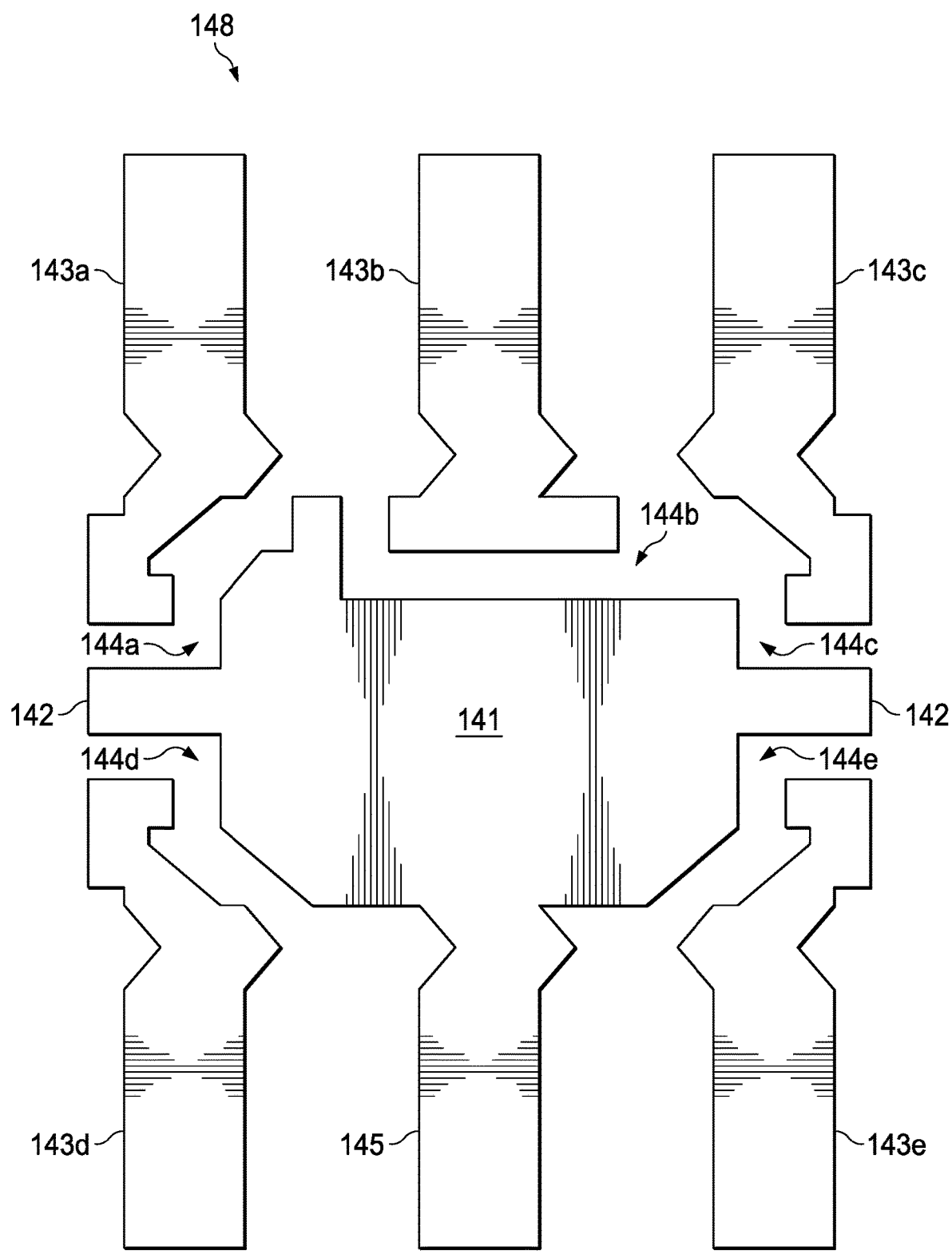
FIG. 2A is a top view of the planar profile of a leadframe of the semiconductor package of FIGS. 1A-1F.
Figure 2B:
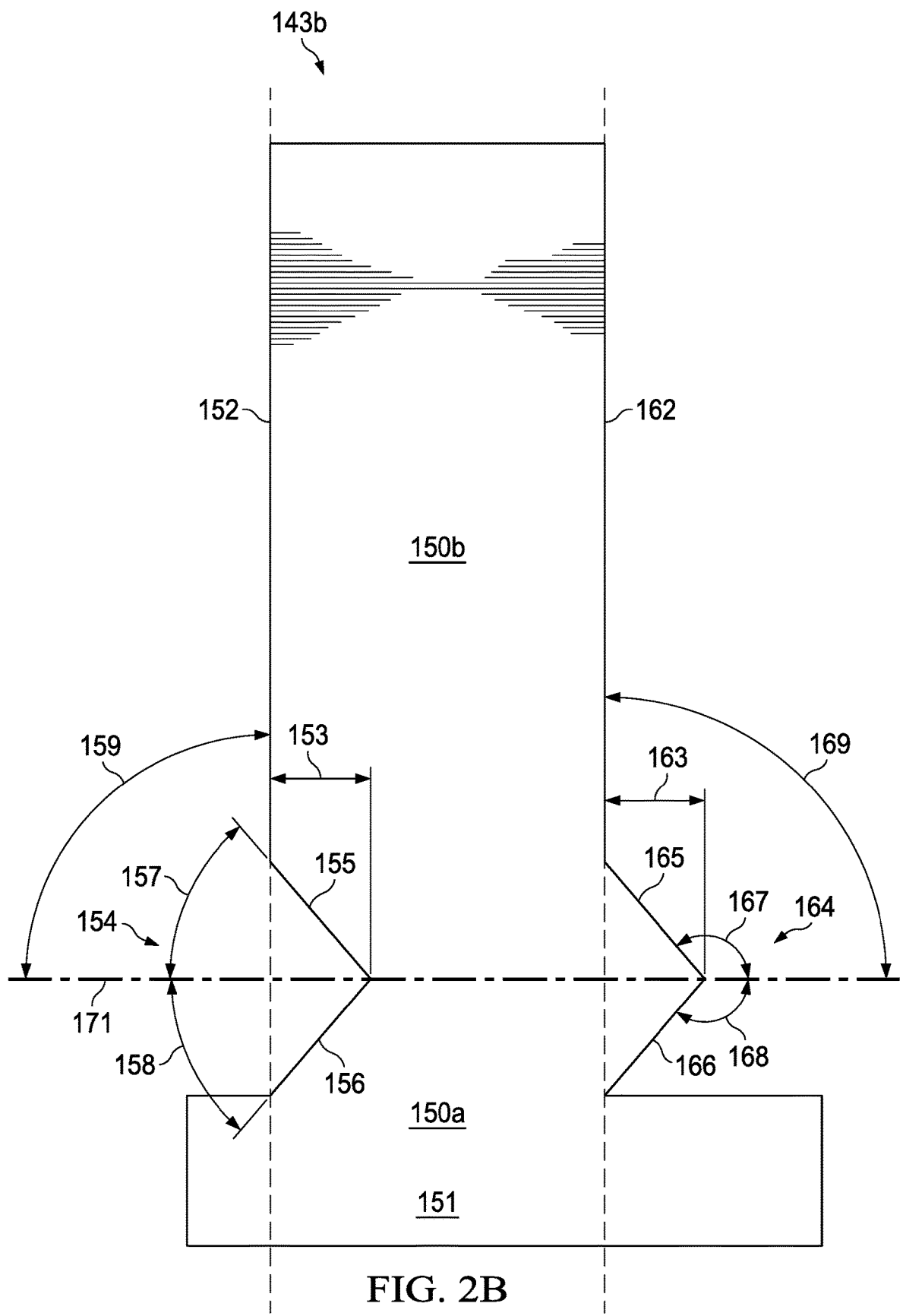
FIG. 2B is a top close-up view of a lead including a shifted neck within the planar profile of the leadframe of FIG. 2A.

FIG. 2A is a top view of a planar profile 148 of leadframe 140, and FIG. 2B is a top close-up view of lead 143b within planar profile 148 of leadframe 140. Whereas leadframe 140 is shown in its final configuration in FIGS. 1A and 1B with leads 143 and pad lead 145 bent out-of-plane relative to pad 141, planar profile 148 represents the shape of leadframe 140 prior to bending of leads 143 and pad lead 145 during manufacturing. Planar profile 148 shaped from a planar base metal. As discussed above, the base metal may include plated layers that mitigate corrosion of exposed portions.

As shown in FIG. 2B, lead 143b includes a shifted lead neck within planar profile 148 of leadframe 140, which is representative of the shifted lead necks for the other leads 143 and pad lead 145. Lead 143b includes a covered portion 150a, which is covered by mold compound 170 within semiconductor package 100, and an uncovered portion 150b, which is exposed outside of mold compound 170. Covered portion 150a and uncovered portion 150b are collectively referred to as lead shape 150. Outer surface 171 of mold compound 170 separates covered portion 150a from uncovered portion 150b. Portions of leads 143 covered by mold compound 170, including covered portion 150a of lead 143b, are co-planar with pad 141, while portions of leads 143 outside mold compound 170, including uncovered portion 150b of lead 143b, are bent out-of-plane. Lead stitch area 151 is on covered portion 150a such that stitch bond 132 is covered by mold compound.

As part of semiconductor package 100, mold compound 170 is adhered to covered portion 150a of lead 143b such that stitch bond 132 is encapsulated within mold compound 170. Mold compound 170 forms mating surfaces with areas of notch 154 and protrusion 164 of lead 143b covered by mold compound 170. The mating surfaces engage lead 143b to isolate portions of respective lead 143 covered by mold compound 170 from pulling forces caused by bending the uncovered portion 150b of respective lead 143.

As shown in FIG. 2A, leads 143a, 143b, 143c, 143d, 143e are spaced from pad 141 by respective gaps 144a, 144b, 144c, 144d, 144e. Two tie bars 142 and pad lead 145 extend from pad 141. Each of gaps 144 are covered by mold compound 170 within semiconductor package 100. In some examples, a minimum distance of gaps 144 spacing leads 143 from pad 141 is no greater than 150 microns. In such examples, smaller gaps may be difficult to manufacture due to constraints of photoetching techniques and/or not provide sufficient electrical isolation between adjacent leads.

Leads 143 and pad lead 145 include

Shapes of each of the five leads 143 and pad lead 145 within planar profile 148 of leadframe 140 include a lead neck within and adjacent to the mold compound and a lead leg adjacent to the lead neck and outside the mold compound. The lead necks include notches representing indents relative to first elongated sides of each lead 143 and protrusions protruding outwardly relative to second elongated sides of each lead 143.

For example, as shown in FIG. 2B, lead shape 150 of lead 143b within the planar profile 148 of leadframe 140 includes sides 152, 162 of leg region outside mold compound 170. Side 152 is at an angle 159 of 80 to 100 degrees, such as 85 to 95 degrees, relative to outer surface 171 of mold compound 170. Similarly, side 162 is at an angle 169 of 80 to 100 degrees, such as 85 to 95 degrees, relative to outer surface 171. In some examples, side 152 may be parallel to side 162 such that the leg region of lead 143b maintains a consistent width. In the same or different examples, sides 152, 162 may be about perpendicular to outer surface 171 within planar profile 148.

Lead shape 150 further includes a notch 154 indented relative to a first elongated side 152 of lead shape 150 and a protrusion 164 protruding outwardly relative to a second elongated side 162 of lead shape 150. In combination, notch 154 and protrusion 164 represent the shifted neck of lead 143b.

Uncovered portion 150b of lead 143b extends beyond mold compound 170. Specifically, protrusion 164 and notch 154 are partially within mold compound 170 and partially outside mold compound 170 such that an outer surface of mold compound 170 contacts both protrusion 164 and notch 154. In some examples, protrusion 164 and notch 154 are about centered about mold compound surface 171 such that an apex of protrusion 164 and a low point of notch 154 are proximate an outer surface of mold compound 170. In this manner, the portions of protrusion 164 and notch 154 within mold compound 170 represent a shifted portion of the lead neck, and the portions of protrusion 164 and notch 154 outside mold compound 170 represent an offsetting shifted portion such that the portions of lead 143b beyond protrusion 164 and notch 154 relative to mold compound 170 are positioned in the same position as it would be absent protrusion 164 and notch 154.

The specific dimensions, angles and shapes of notch 154 and protrusion 164 are selected to coincide with a standard lead layout for board mounting. Following notch 154 and protrusion 164, the remainder of uncovered portion 150b conforms to a lead layout for a standard package. In addition, depth 153 of notch 154 and height 163 of protrusion 164 are selected to avoid narrowing lead 143b. For this reason, depth 153 of notch 154 may be no greater that height 163 of protrusion 164 is some examples. Providing a desired metal to metal clearance of other features within mold compound 170 is another factor in the design of lead shape 150, including notch 154 and protrusion 164. For example, particular manufacturing techniques such as stamping or etching may require a minimum clearance in the design of lead shape 150. As another example, a minimum separation distance may be required to provide sufficient electrical isolation between adjacent leads. In this particular example, the distance of the shift offset provided by notch 154 and protrusion 164 is at least 0.10 mm, which corresponds to a minimum depth 153 of notch 154 and a minimum height 163 of protrusion 164.

In the present example, notch 154 is formed by a first notch side 155 at an angle 157 of 30 to 60 degrees, such as 40 to 50 degrees, relative to outer surface 171 of mold compound 170 and a second notch side at an angle 158 of 30 to 60 degrees, such as 40 to 50 degrees, relative to outer surface 171 of mold compound 170. Second notch side 156 also forms an angle of 60 to 120 degrees, such as 80 to 100 degrees, relative to first notch side 155. In some examples, angles 157, 158 may be about 45 degrees, such that the angle between first notch side 155 and second notch side 156 is about 90 degrees. These example ranges allow for sufficient engagement between notch 154 and mold compound 170 to resist delamination during lead bending. At steeper angles, mold compound 170 within notch 154 becomes thin, limiting its strength. If this portion of mold compound 170 deflects during lead bending, delamination may still occur. At flatter angles, mold compound 170 does not engage notch 154 as well to resist delamination during lead bending.

Similarly, protrusion 164 is formed by a first protrusion side 165 an angle 167 of 120 to 150 degrees, such as 130 to 140 degrees, relative to outer surface 171 and a second protrusion side 166 an angle 168 of 120 to 150 degrees, such as 130 to 140 degrees, relative to outer surface 171. Second protrusion side 166 also forms a 240 to 300 degree angle relative to first protrusion side 165. In some examples, angles 167, 168 may be about 135 degrees, such that the angle between first protrusion side 165 and second protrusion side 166 is about 270 degrees. These example ranges allow for sufficient engagement between protrusion 164 and mold compound 170 to resist delamination during lead bending. At steeper angles, mold compound 170 between protrusion 164 and outer surface 171 becomes thin, limiting its strength. If this portion of mold compound 170 deflects during lead bending, delamination may still occur. At flatter angles, mold compound 170 does not engage protrusion 164 as well to resist delamination during lead bending.

FIGS. 3A-3G illustrate conceptual process steps for manufacturing a semiconductor package including leads with shifted lead necks, the steps including molding, singulation, and bending leads. FIG. 4 is a flowchart of a method of fabricating a semiconductor package including leads with shifted lead necks. For clarity, the method of FIG. 4 is described with reference to semiconductor package 100 and FIGS. 3A-3G; however, the described techniques may be adapted to other package designs and are not limited to the specific example of semiconductor package 100.

As shown in FIG. 3A, leadframe strip 240 includes multiple interconnected leadframes 140 formed from a single sheet of metal by stamping or etching. The leadframes 140 of leadframe strip 240 may be arranged in a single row or in an array of rows and columns. Tie bars, such as tie bars 142, interconnect leads and other elements of each leadframe 140 to one another as well as to elements of adjacent leadframes 140 of leadframe strip 240. Leadframe strip 240 may also include a siderail that surrounds the array of leadframes to provide rigidity and support leadframe elements on the perimeter of leadframe strip 240. The siderail may also include alignment features to aid in manufacturing.

In various examples, manufacturing leadframe strip 240 may include stamping or photo etching a planar base metal to form the profile of leadframe strip 240. The profile of leadframe strip 240 includes planar profile 148 (FIG. 2A) of leadframe 140 with pad 141 and leads 143 for each of the leadframes of leadframe strip 240, as well the elements to interconnect adjacent leadframes, such as tie bars 142 and optional siderail(s) around the leadframes of leadframe strip 240. As described previously, the planar base metal with the profile of leadframe strip 240 may be plated after the stamping or photo etching. The plated layer(s) may resist corrosion and/or enable metal-to-metal bonding.

A semiconductor die 110 is mounted on pad 141 of each leadframe 140 of leadframe strip 240 using die attach 210 (FIG. 4, step 302). Die attach 210 may represent an adhesive, such as thermal interface material, such as a conductive or nonconductive thermal paste. Such examples may facilitate heat dissipation from semiconductor die 110 through pad 141.

As shown in FIG. 3B, for each semiconductor die 110 mounted on leadframe strip 240, wire bonds 130 are formed from its bond pads 112 to adjacent leads 143 and with a wire using a capillary of a metal wire bonder (FIG. 4, step 304). For example, forming wire bonds 130 between a bond pads 112 (FIG. 1A) and an lead 143 (FIG. 1A) may include forming a free air ball, squashing the ball onto either the bond pad 112 or the lead 143 to form a ball bond (131 in FIG. 1A; usually based on creating intermetallics), spanning the wire to the other of the respective lead 143 or bond pad 112, pressuring the wire to the lead to form stitch bond (132 in FIG. 1A), and breaking the wire.

Figure 3C:
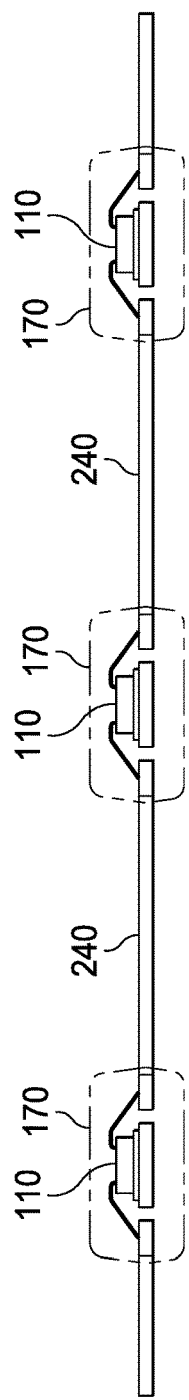
Figure 4:
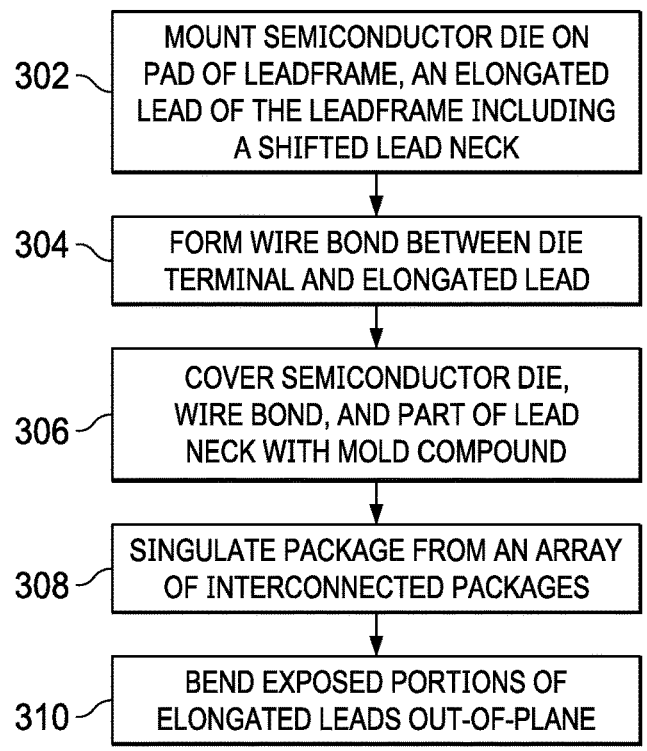
FIG. 4 is a flowchart of a method of fabricating a semiconductor package including leads with shifted lead necks, such as the semiconductor package of FIGS. 1A-1F.

As shown in FIG. 3C, for each semiconductor package 100 formed with leadframe strip 240, semiconductor die 110, wire bonds 130, and portions of the leads 143 are covered with mold compound 170 (FIG. 4, step 306). Individual semiconductor packages 100 remain interconnected as part of leadframe strip 240 after being covered with mold compound 170. For each semiconductor package 100 of leadframe strip 240, following the application of mold compound 170, notch 154 (FIG. 2B) and protrusion 164 (FIG. 2B) are each partially covered by mold compound 170 and partially outside mold compound 170. In this manner, partially covering notch 154 and protrusion 164 with mold compound 170 locates protrusion and notch 154 and protrusion 164 partially within mold compound 170 and partially outside mold compound 170 such that the outer surface of mold compound 170 contacts both notch 154 and protrusion 164.

Figure 3D:
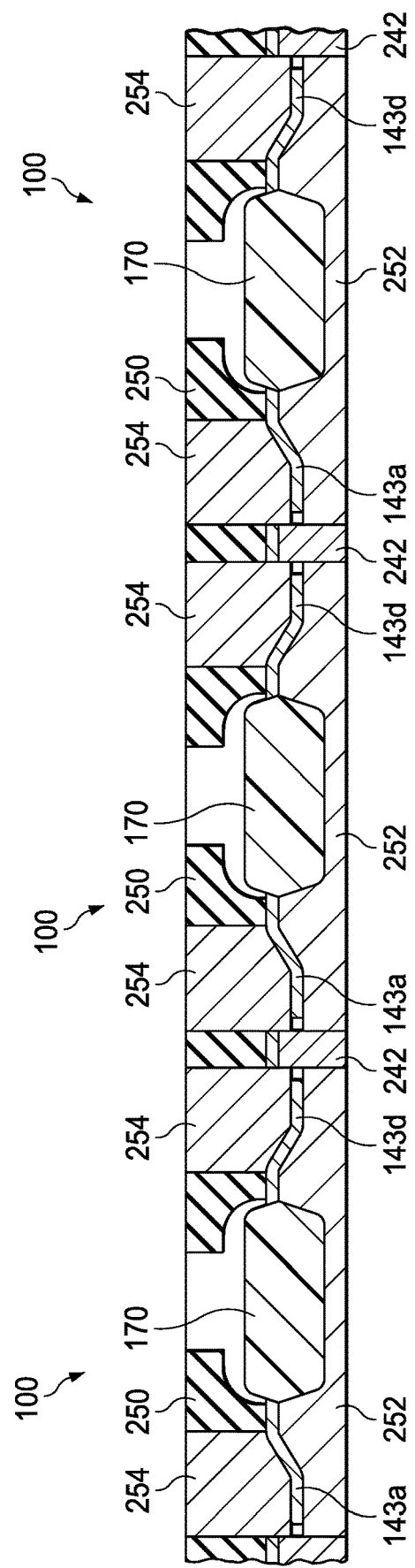

As shown in FIG. 3D, following molding of mold compound 170, package 100 is singulated from the array of interconnected packages manufactured on leadframe strip 240 (FIG. 4, step 308). For example, singulation may include cutting through leadframe strip 240 to separate semiconductor package 100 from a plurality of semiconductor packages 100 manufactured on leadframe strip 240.

While singulation may represent an independent process step, in the example of FIG. 3D, singulation is performed in conjunction with a first bending step to shape leads 143 and pad lead 145. Such cutting may include shearing or pinch trimming with a bending die.

Figure 3E:
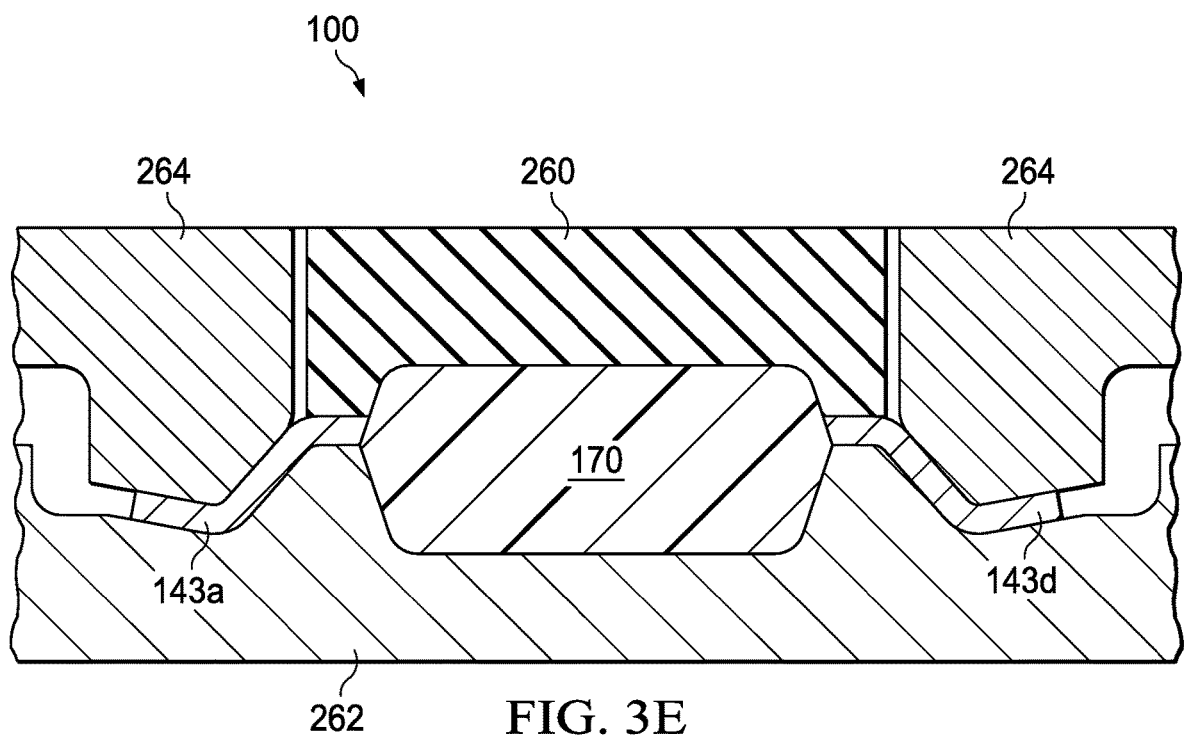
Figure 3F:
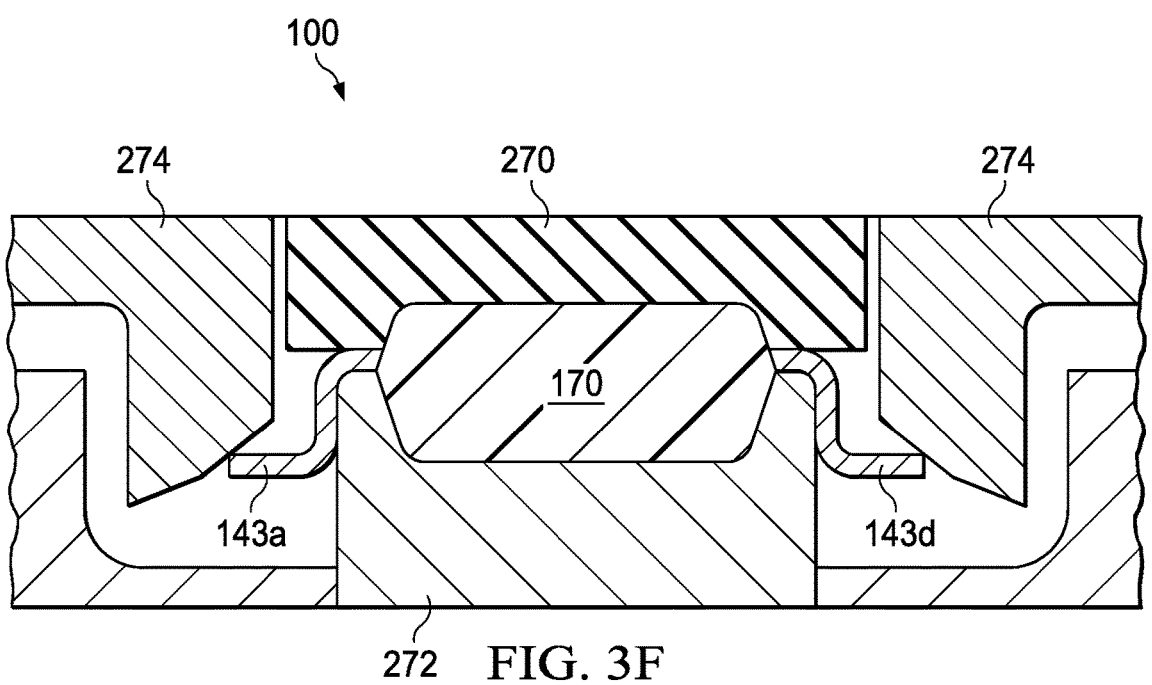

FIGS. 3D-3F illustrate incremental bending steps with bending dies to shape exposed portions of leads 143 and pad lead 145 within planar profile 148 (FIG. 2A) of leadframe 140 out-of-plane with pad 141 (FIG. 1A) of leadframe 140 (FIG. 4, step 310). In FIG. 3D, die pad 250 secures leadframe strip 240 against lower die 252. Then upper die 254 moves towards lower die 252 to separate leads 143 and pad lead 145 (as represented by leads 143*a*, 143*d*) from siderails 242, which serve as interconnections between adjacent leadframes 140 of leadframe strip 240. Upper die 254 also stamps leads 143 and pad lead 145 against lower die 252 bending exposed portions of leads 143 and pad lead 145 out-of-plane relative to pad 141.

The process of FIG. 3D repeats as shown in FIGS. 3E and 3F to bend exposed portions of leads 143 and pad lead 145 into their final positions. More specifically, in FIG. 3E, die pad 260 secures semiconductor package 100 against lower die 262. Then upper die 264 moves towards lower die 262 to stamp leads 143 and pad lead 145 against lower die 262 further bending exposed portions of leads 143 and pad lead 145 out-of-plane relative to pad 141. Likewise, in FIG. 3F, with die pad 270 securing semiconductor package 100 against lower die 272, upper die 274 moves towards lower die 272 to stamp leads 143 and pad lead 145 against lower die 272 bending leads 143 and pad lead 145 into their final positions.

Figure 3G:
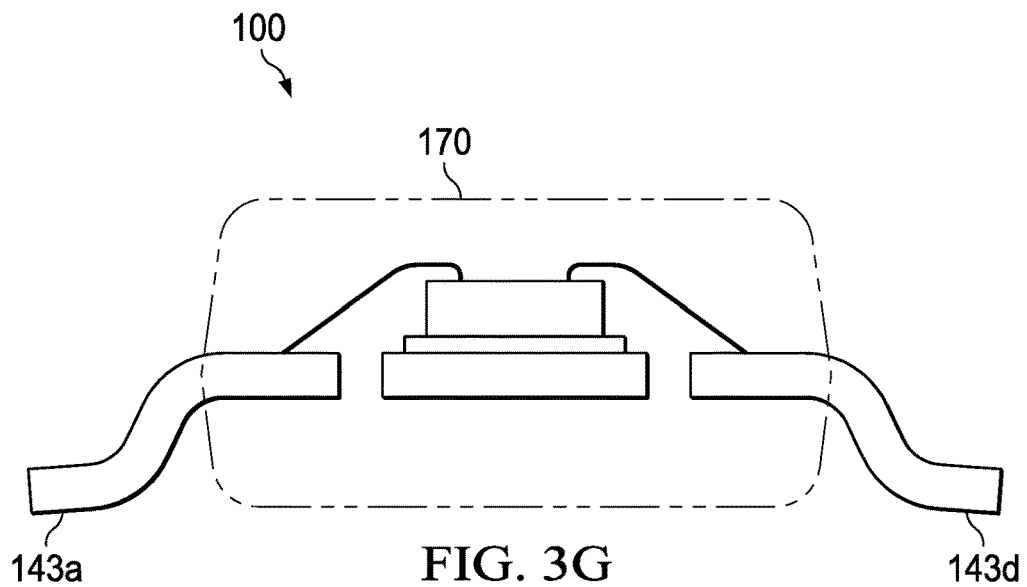

Following the bending of leads 143, 145, portions of leads 143, 145 covered by mold compound 170 are co-planar with pad 141, while portions of leads 143, 145 outside mold compound 170 are bent out-of-plane. As shown in FIG. 3G, a completed semiconductor package 100 is removed from the bending die of FIG. 3F. The completed semiconductor packages 100 provide the lead profiles of semiconductor package 100 as illustrated in FIGS. 1A-1E.

The specific techniques for semiconductor packages including leads with shifted lead necks, such as semiconductor package 100, are merely illustrative of the general inventive concepts included in this disclosure as defined by the following claims. As an example, this disclosure applies not only to active semiconductor devices with low and high pin counts, such as transistors and integrated circuits, but also to semiconductor packages with any combination of active and passive components on a leadframe.

What is claimed is:

1. A semiconductor package comprising:
   a pad and leads having a planar profile shaped from a planar base metal;
   a semiconductor die attached to the pad;
   a wire bond extending from the semiconductor die to a respective lead; and
   mold compound covering the semiconductor die, the wire bond, and a first portion of the respective lead, wherein a second portion of the respective lead extends beyond the mold compound through a surface of the mold compound,
   wherein a shape of the respective lead within the planar profile includes a lead neck within and adjacent to the mold compound and a lead leg adjacent to the lead neck and outside the mold compound,
   wherein the lead neck forms a first side at least partially within the mold compound, the first side extending at a first angle of 30 to 60 degrees relative to the surface of the mold compound through which the lead neck extends,
   wherein the lead neck forms a second side at least partially outside the mold compound, the second side adjacent the first side and extending at a second angle of 30 to 60 degrees relative to the surface of the mold compound through which the lead neck extends,
   wherein the lead neck forms a third side at least partially within the mold compound, the third side opposite the first side and extending at a third angle of 120 to 150 degrees relative to the surface of the mold compound through which the lead neck extends, and
   wherein the lead neck forms a fourth side at least partially outside the mold compound, the fourth side adjacent the second side and extending at a fourth angle of 120 to 150 degrees relative to the surface of the mold compound through which the lead neck extends.

2. The semiconductor package of claim 1,
   wherein the mold compound forms mating surfaces with areas of the lead neck covered by the mold compound, and
   wherein the mating surfaces engage the respective lead to isolate portions of the respective lead covered by the mold compound from pulling forces caused by bending the second portion of the respective lead.

3. The semiconductor package of claim 1,
   wherein the lead leg forms a fifth side, the fifth side adjacent the second side and extending at a fifth angle of 85-95 degrees relative to the surface of the mold compound through which the lead neck extends, and
   wherein the lead leg forms a sixth side, the sixth side opposite the fifth side, adjacent the fourth side and extending at a sixth angle of 85-95 degrees relative to the surface of the mold compound through which the lead neck extends.

4. The semiconductor package of claim 1,
   wherein the first angle is at 40 to 50 degrees,
   wherein the second angle is at 40 to 50 degrees,
   wherein the third angle is at 130 to 140 degrees, and
   wherein the fourth angle is at 130 to 140 degrees.

5. The semiconductor package of claim 1,
   wherein the second angle is opposite the first angle such that the first side and the second side form a fifth angle of 60 to 120 degrees,
   wherein the fourth angle is opposite the third angle such that the third side and the fourth side form a sixth angle of 240 to 300 degrees.

6. The semiconductor package of claim 1,
   wherein the first side and the second side of the lead neck form a protrusion,
   wherein the third side and the fourth side of the lead neck form a notch,
   wherein the notch and the protrusion are each partially covered by the mold compound and partially outside the mold compound.

7. The semiconductor package of claim 1, wherein the wire bond is encapsulated within the mold compound.

8. The semiconductor package of claim 1,
   wherein the planar base metal is plated with a plated layer enabling metal-to-metal bonding and resistant to oxidation, and
   wherein the wire bond is less resistant to oxidation than the plated layer.

9. The semiconductor package of claim 8, wherein the wire bond includes a ball bond attached to the semiconductor die, and a stitch bond attached to the respective lead.

10. The semiconductor package of claim 1,
wherein the leads include at least five leads spaced from the pad by a gap, the planar profile further including a pad lead extending outside the mold compound from the pad, and
wherein shapes of each of the five leads and the pad lead within the planar profile include notches representing indents relative to lead legs of each lead and protrusions protruding outwardly relative to the lead legs of each lead.

11. The semiconductor package of claim 10, wherein the notches and the protrusions of each of the five leads and the pad lead are partially covered by the mold compound and partially outside the mold compound.

12. The semiconductor package of claim 10, wherein a minimum distance of the gap spacing the leads from the pad is no greater than 150 microns.

13. The semiconductor package of claim 1, wherein portions of the leads covered by the mold compound are co-planar with the pad, while the portions of the leads outside the mold compound are bent out-of-plane.

14. The semiconductor package of claim 13,
wherein the respective lead forms a first out-of-plane bend outside and adjacent to the mold compound with a first out-of-plane angle between 80 and 90 degrees, and
wherein the respective lead forms a second out-of-plane bend outside the mold compound past the first out-of-plane bend with a second out-of-plane angle of between 80 and 90 degrees, the second out-of-plane angle opposite the first out-of-plane angle such that a distal end of the respective lead beyond the second out-of-plane bend is within 10 degrees of parallel with the pad.

15. The semiconductor package of claim 1, wherein the pad and the leads are etched from the planar base metal.

* * * * *